US005307027A

United States Patent [19]

Grasset

[11] Patent Number: 5,307,027

[45] Date of Patent: Apr. 26, 1994

[54] CURRENT MIRROR WITH LOW COPYING ERROR

[75] Inventor: Jean-Charles Grasset, Fontaine, France

[73] Assignee: Thomson Composants Militaires et Spatiaux, Courbevoie, France

[21] Appl. No.: 974,883

[22] Filed: Nov. 12, 1992

[30] Foreign Application Priority Data

Nov. 22, 1991 [FR] France ................................ 91 14405

[51] Int. Cl.[5] ............................................ H03F 3/04
[52] U.S. Cl. .................................... 330/288; 330/288
[58] Field of Search ................ 330/288, 289; 323/315, 323/316; 307/491

[56] References Cited

U.S. PATENT DOCUMENTS 3,843,933 10/1974 Ahmed .
4,237,414 12/1980 Stein .

FOREIGN PATENT DOCUMENTS 0419819 4/1991 European Pat. Off. .
2738205 3/1978 Fed. Rep. of Germany .

OTHER PUBLICATIONS

RCA Technical Notes, No. 949, Dec. 31, 1973, 7 pages, Jonathan S. Radovsky, "Current-Mirror Amplifiers Having Current Gains Less Influenced by the Base Currents of Component Transistors".

*Primary Examiner*—Steven Mottola
*Attorney, Agent, or Firm*—Oblon, Spivak, McClelland, Maier & Neustadt

[57] ABSTRACT

The disclosure relates to current mirrors in which a high level of copying error may arise out of the collapse of the gain of the transistors. The mirror includes, in its output arm, a "Darlington" type amplifier subjected to feedback by a buffered mirror. The error gets cancelled for a gain $\beta=1$. A second Darlington amplifier mounted symmetrically with the first Darlington enables the $V_{CE}$ values of the transistors to be balanced. The disclosed device can be applied to current mirrors when the transistors are low-gain transistors ($\simeq 1$).

8 Claims, 1 Drawing Sheet

CURRENT MIRROR WITH LOW COPYING ERROR

BACKGROUND OF THE INVENTION

1. Field of the Invention

The present invention relates to a current mirror with bipolar transistors, working with high precision even if the transistors are very low gain transistors.

It is known that bipolar transistors have characteristics that change with the conditions of use, or even during manufacture. In particular the gain, in current, decreases when the temperature diminishes, or under the effect of a radiation of light or particles. The loss of gain leads to an intrinsic copying error in the current mirrors.

2. Description of the Prior Art

A current mirror is an assembly, such as the one shown in FIG. 1, which enables the enforcement, through a second arm, of a current $I_0$ which, except for errors, is identical to the current $I_1$ that flows through a first arm. The first arm comprises a current source 1, a transistor 2, the collector of which is connected to the base, and a negative feedback resistor 3. The second arm comprises a transistor 5 and a negative feedback resistor 6. The bases of the two transistors 2 and 5 are joined in such a way that the current $I_1$ which flows in the first arm controls the current $I_0$ enforced through a load 7 in the second arm.

This type of simple current mirror suffers from an intrinsic copying error which depends on the gain of the transistors. Indeed, for a simple mirror with a gain equal to unity, the transistors 2 and 5 of which are matched in terms of $V_{BE}$ (base-emitter voltage) and the negative feedback resistors 3 and 6 of which are matched, the error in the gain of the mirror is expressed through the equation:

$$I_0=I_1[1-2/(\beta+2)]$$

$\beta$ being the gain of the transistors, the same for the two transistors since they are assumed to be identical and under the same conditions of bias. The relative copying error is equal to $-2/(\beta'2)$ and, in most applications, with transistors having a gain that is far greater than 1, this error is not the main cause of any observed lack of imprecision, and it remains masked by the offset voltage of the pair of transistors or the non-matching of the negative feedback resistors 3 and 6. However, as soon as the gain of the transistor decreases, for any reason, the error due to the low gain ($\beta<1$) becomes predominant. Indeed, it is seen that the gain $\beta$ comes into play linearly and at the denominator of the equation, in such a way that, when the gain tends towards zero, the error tends towards $-100\%$.

The current applications of electronics make it necessary, however, to have mirror copying precision of over 10% which can be expected with transistors that have undergone constraints, having a low gain, for example of 1 to 10.

A first known approach is presented by the Wilson mirror shown in FIG. 2. This is the equivalent of a standard mirror in which the amplifier transistor 8 is subjected to negative feedback by the mirror constituted by the transistors 2 and 5. In this figure as in the following figures, the load 7 is no longer shown since it is not a factor in the understanding of the invention.

Assuming that the three transistors have the same gain $\beta$, the gain error of the Wilson mirror is expressed by a quadratic relationship:

$$I_0=I_1[1-2/(\beta^2+2\beta+2)]$$

A second known approach lies in the buffered mirror shown in FIG. 3. In this assembly, the transistors of the master and copying arms, respectively 2 and 5, have their base currents not tapped directly from the source $I_1$ as in the case of FIG. 1, but through an amplifier transistor 9 the base of which is connected to the source $I_1$ and the emitter to the two bases of the transistors 2 and 5, the collector of this transistor 9 being supplied with a draw-back volta $V_R$. The error is given by:

$$I_0=I_1[1-2/(\beta^2+\beta+2)]$$

For transistor gains far greater than 1, the error that is introduced by this Wilson mirror and this buffered mirror has the shape $-2/\beta^2$ and gives a very substantial improvement of the simple mirror: for $\beta=100$, the error goes from $-2\%$ to $-0.02\%$, which becomes negligible. However the effect of the quadratic law diminishes when the gain of the transistor becomes close to or below 1. For example, the Wilson mirror has an error of the order of $-8\%$ for a gain of the transistors equal to $\beta=4$.

SUMMARY OF THE INVENTION

The invention provides a solution to this problem by proposing an assembly such that the equation of the copying current $I_0$ comprises a term that gets cancelled at the numerator, in such a way that the error gets cancelled for a low value of gain of the transistors. According to the invention, a current mirror with low copying error is characterized in that its output (Io) is constituted by the joined collectors of two transistors mounted as a "Darlington" type current amplifier, its input ($I_1$) is constituted by the base of the same amplifier, said amplifier being biased by means of a shunt-shunt type feedback carried out between its emitter and its base by a buffered type mirror provided with negative feedback resistors.

More specifically, the invention relates to a current mirror with low copying error comprising an input arm and an output arm, as well as a "bufferd" type of current mirror itself constituted by a first master arm and by a second copying arm, said current mirror with low copying error comprising, in its output arm, a first Darlington type current amplifier, the collector of which constitutes the output of the mirror and the base of which is connected to the input arm, this amplifier being subjected to feedback in shunt-shunt mode by the buffered type current mirror, the master arm of which is connected to the emitter of the Darlington amplifier and the copying arm of which is connected to the base of the Darlington amplifier.

BRIEF DESCRIPTION OF THE DRAWINGS

The invention will be understood more clearly from the following description of an exemplary embodiment, made with reference to the appended drawing wherein.

MORE DETAILED DESCRIPTION

To simplify the description, the invention shall be described with reference to NPN transistors, which in no way limits the scope of the invention.

Figure 1:
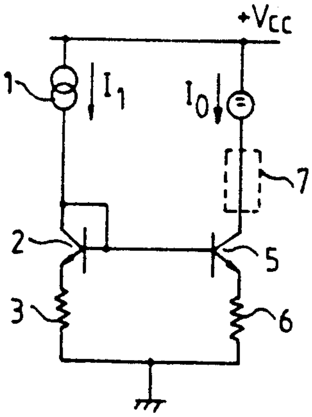
FIG.1 PRIOR ART
FIGS. 1, 2, 3 are drawings of current mirrors according to the prior art, explained here above.
Figure 2:
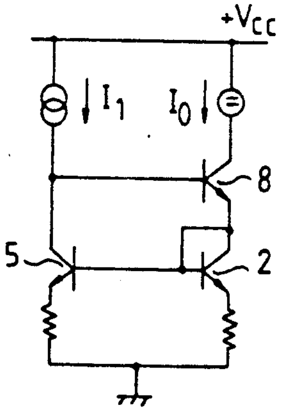
FIG.2 PRIOR ART
Figure 3:
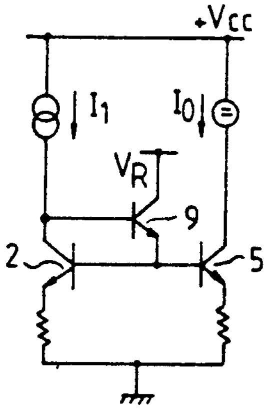
FIG.3 PRIOR ART
Figure 4:
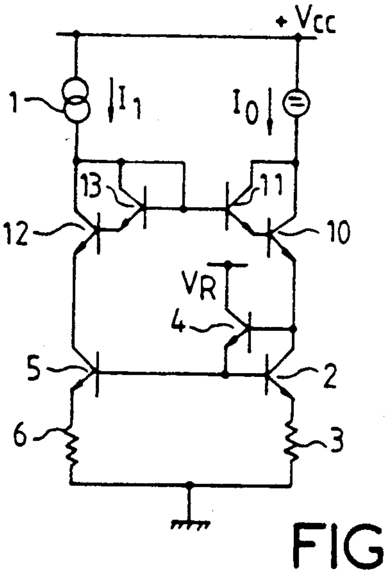
FIG. 4 shows a drawing of a current mirror according to the invention.

FIG. 4 shows a current mirror with low gain transistors according to the invention. This mirror according to the invention has, among other elements, the elements of a buffered mirror according to the prior art, comprising:

- a first master arm that is inserted in series in the output arm of the mirror of the invention, which comprises a transistor 2 and a negative feedback resistor 3;
- a second copying arm that is inserted in series in the input arm of the mirror of the invention and comprises a transistor 5 and a negative feedback resistor 6.

The bases of the two transistors 2 and 5 are joined together and a transistor 4 supplied with a draw-back voltage $V_R$ is mounted as an amplifier between the collector and the base of the transistor 2.

The invention uses this buffered mirror to subject a Darlington type current amplifier to negative feedback in shunt-shunt mode, the output (or collector) of this amplifier constituting the output of the mirror according to the invention, and the input (the base) of this amplifier constituting the input of the mirror according to the invention. This "Darlington" comprises:

- a transistor 10, the collector of which is joined to the voltage source VCC and the emitter of which is joined to the collector of the transistor 2;
- a transistor 11, the collector of which is joined to the voltage source VCC and the base of which is controlled by the input arm of the mirror according to the invention (source $I_1$).

As in the standard mirrors, emitter negative feedback resistors 3 and 6 enable the offset error of the transistors to be eliminated to the extent that they are matched if the degeneration (namely the product of the value of the negative feedback resistor and of the current that flows through it) is equal to some $kT/q \simeq 26$ mV to 300° K., with k=Boltzmann's constant, T=absolute temperature and q=charge of the electron.

In the case of a fast technology in which the gain depends greatly on the voltage $V_{CE}$, it is advantageous to complement the mirror according to the invention by means of two transistors 12 and 13, mounted symmetrically with respect to the Darlington amplifier 10+11, the bases of the transistors 13 on the input arm and 11 on the output arm being interconnected and connected to the collectors of the transistors 12 and 13. The transistors 12 and 13 have a role of balancing the voltages $V_{CE}$ of the transistors 2 and 5 of the buffered mirror in order to eliminate the error due to the Early effect of the transistors. Again in this example of low voltage, the reference voltage $V_R$ of the collector of the transistor 9 is chosen in such a way as to match the values of $V_{CE}$ so that that $V_{CE9} \simeq V_{CE11}$.

Figure 5:
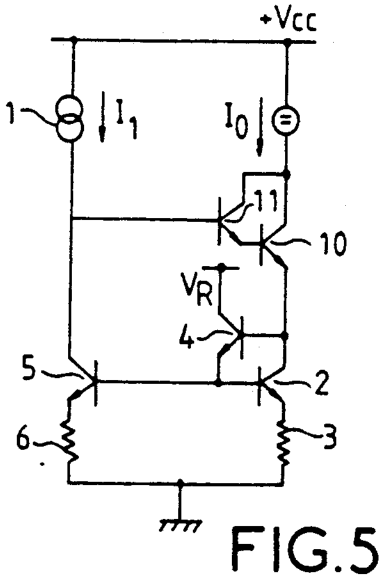
FIG. 5 shows a drawing of a version of the above mirror, in the case of high-voltage technology.

In the case of high voltage technology, namely technology using some hundreds of volts, the Early effect is more negligible than in the case of a fast technology. The balancing of the voltages $V_{CE}$ of the buffered mirror may be eliminated and, consequently, the transistors 12 and 13 are eliminated, as can be seen in FIG. 5 which is a simplification of FIG. 4.

The value of the current mirror structure according to the invention lies in the existence of a root of the numerator which cancels the error, in the function of the error due to the gain, a function written as follows:

$$I_0 \simeq I_1[1+(2\beta-2)/(\beta^4+3\beta^3+4\beta^2+2\beta+2)]$$

In this equation, it has been assumed that all the transistors of the mirror have the same gain, which warrants the sign $\simeq$.

Figure 6:
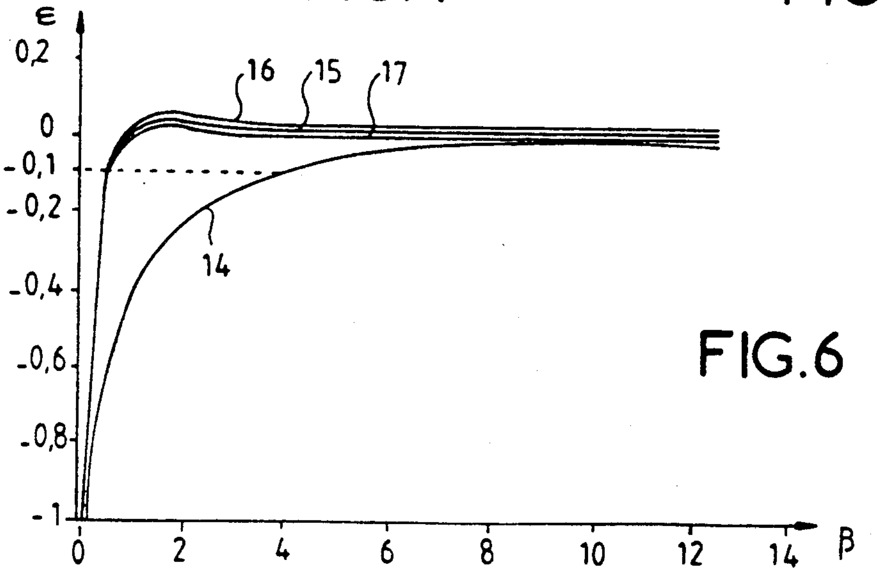
FIG. 6 shows curves of error on the gain, with comparisons between the prior art and the invention.

In the prior art current mirrors, the error has a constant sign which is always negative, and it increases in absolute value when the gain $\beta$ of the transistors diminishes: it is equal to between −40% and −70% when $\beta=1$, as is shown by the curve 14 in FIG. 6. In this figure, the gain $\beta$ at low values (0–14) is shown on the x-axis while the corresponding error $\epsilon=(I_0-I_1)I_1$ is given on the y-axis and the curve 14 is relative to a Wilson structure.

On the contrary, in the mirror according to the invention, the error gets cancelled for $(2\beta-2)=0$, namely $\beta=1$, and it changes its sign depending on whether the gain is greater than or smaller than 1. A typical curve is shown at 15 in FIG. 6, thus making it possible to compare it with the curve 14 of a Wilson mirror. The positive error hump observed for the gains slightly greater than 1 are equal only +2% to +3% and it remains negligible in this zone for which a standard mirror is assigned an error of the order of −40%. For $\beta=1$, the error is strictly zero $(2\beta-2=0)$ and for $\beta<1$, the observed error remains smaller than that achieved with a known mirror.

FIG. 6 shows a straight line in dashes at the level of a gain error of the mirror equal to −10%, which is an example of a practically acceptable error. This straight line shows that the mirror according to the invention tolerates transistors, the gain of which is about 0.75, i.e. five times smaller than the 3.5 gain of the transistors necessary for the Wilson mirror, with a same loss of −10%.

Furthermore, the usefulness of the transfer function, which comprises a zone in which $\beta<1$ is affected neither by problems of matching of gains of the transistors used nor by problems of matching of the negative feedback resistors 3 and 6.

For example, in FIG. 6, curves 15, 16, 17 illustrate the influence (minimum, typical and maximum) of a non-matching of the negative feedback resistors by ±2% when the degeneration voltage is fixed at a practical value of about 250 mV. The upper curve 16 corresponds to a non-matching.

$$\frac{\Delta(R_1/R_2)}{R_1/R_2} = +2\%$$

and the lower curve 17 corresponds to −2%. The variations of the error curve about its nominal position are highly acceptable.

Apart from the usefulness of being able to work with very low transistor gain values, the current mirror according to the invention has the advantage of having very high output impedance at low frequency. As compared with the Wilson mirror, which has a reputation of having high output impedance, the improvement obtained is typically by a factor of 100.

The invention is specified by the following claims.

What is claimed is:

1. A current mirror, comprising:

an input arm;

an output arm including a Darlington amplifier having the collector thereof as an output of the current mirror and the base thereof connected to the input arm; and a buffered current mirror including a master arm and a copying arm, the master arm connected to the emitter of said Darlington amplifier and the copying arm connected to the base of said Darlington amplifier;

wherein said Darlington amplifier is subjected to negative feedback in shunt-shunt mode by said buffered current mirror.

2. A current amplifier according to claim 1, wherein said Darlington amplifier and said buffered current mirror comprise low gain bipolar transistors.

3. A current mirror according to claim 1, wherein an error of copying of the input arm by the output arm has a small dependency on a gain of transistors in the current mirror when the $\beta$ of the transistors is less than 2 and said error is zero when the $\beta$ of the transistors is 1.

4. A current mirror according to claim 1, wherein an error of copying of the input arm by the output arm has a small dependency on a matching of negative feed back resistors in said buffered current mirror and a matching of gains of transistors in the current mirror.

5. A current mirror, comprising:

an input arm including a first Darlington amplifier having the collector thereof as an input of the current mirror and the base thereof short-circuited to the collector thereof;

an output arm including a second Darlington amplifier having the collector thereof as an output of the current mirror and the base thereof connected to the base of the first Darlington amplifier; and a buffered current mirror including a master arm and a copying arm, the master arm connected to the emitter of the second Darlington amplifier and the copying arm connected to the emitter of the second Darlington amplifier;

wherein said first Darlington amplifier is subjected to negative feedback in shunt-shunt mode by said buffered current mirror.

6. A current amplifier according to claim 5, wherein said Darlington amplifiers and said buffered current mirror comprise low gain bipolar transistors.

7. A current mirror according to claim 5, wherein an error of copying of the input arm by the output arm has a small dependency on a gain of transistors in the current mirror when the $\beta$ of the transistors is less than 2 and said error is zero when the $\beta$ of the transistors is 1.

8. A current mirror according to claim 5, wherein an error of copying of the input arm by the output arm has a small dependency on a matching of negative feed back resistors in said buffered mirror and a matching of gains of transistors in the current mirror.

* * * * *